United States Patent
Horning et al.

(10) Patent No.: US 9,493,344 B2
(45) Date of Patent: Nov. 15, 2016

(54) MEMS VERTICAL COMB STRUCTURE WITH LINEAR DRIVE/PICKOFF

(75) Inventors: Robert D. Horning, Savage, MN (US); Ryan Supino, Loretto, MN (US)

(73) Assignee: Honeywell International Inc., Morris Plains, NJ (US)

( * ) Notice: Subject to any disclaimer, the term of this patent is extended or adjusted under 35 U.S.C. 154(b) by 1395 days.

(21) Appl. No.: 13/301,172

(22) Filed: Nov. 21, 2011

(65) Prior Publication Data

US 2012/0130672 A1     May 24, 2012

Related U.S. Application Data (60) Provisional application No. 61/416,485, filed on Nov. 23, 2010.

(51) Int. Cl.
*G06F 15/00*     (2006.01)
*B81B 3/00*      (2006.01)

(52) U.S. Cl.
CPC ........ *B81B 3/0086* (2013.01); *B81B 2201/025* (2013.01); *B81B 2203/0136* (2013.01); *Y10T 29/49117* (2015.01)

(58) Field of Classification Search
USPC .............. 73/514.32, 504.12, 504.04, 504.14, 73/514.17, 514.18, 514.38
See application file for complete search history.

(56) References Cited

U.S. PATENT DOCUMENTS

| | | |
|---|---|---|
| 5,497,660 A | 3/1996 | Warren |
| 5,892,153 A | 4/1999 | Weinberg et al. |
| 5,914,553 A | 6/1999 | Adams et al. |
| 5,952,574 A | 9/1999 | Weinberg et al. |
| 5,969,848 A | 10/1999 | Lee et al. |
| 5,986,381 A | 11/1999 | Hoen et al. |
| 6,000,280 A | 12/1999 | Miller et al. |

(Continued)

FOREIGN PATENT DOCUMENTS

| | | |
|---|---|---|
| JP | 10190008 | 7/1998 |
| JP | 2004354108 | 12/2004 |

(Continued)

OTHER PUBLICATIONS

"Temperature Control of CMOS Micromachined Sensors" by Hasnain Lakdawala, 2002.*

(Continued)

*Primary Examiner* — Hezron E Williams
*Assistant Examiner* — Xin Zhong
(74) *Attorney, Agent, or Firm* — Fogg & Powers LLC (57) ABSTRACT

A MEMS sensor comprises a substrate and at least one proof mass having a first plurality of combs. The proof mass is coupled to the substrate via one or more suspension beams such that the proof mass and the first plurality of combs are movable. The MEMS sensor also comprises at least one anchor having a second plurality of combs. The anchor is coupled to the substrate such that the anchor and second plurality of combs are fixed in position relative to the substrate. The first plurality of combs are interleaved with the second plurality of combs. Each of the combs comprises a plurality of conductive layers electrically isolated from each other by one or more non-conductive layers. Each conductive layer is individually coupled to a respective electric potential such that capacitance between the combs varies approximately linearly with displacement of the movable combs in an out-of-plane direction.

15 Claims, 5 Drawing Sheets

(56) References Cited

U.S. PATENT DOCUMENTS

| | | | |
|---|---|---|---|
| 6,181,050 B1 | 1/2001 | Taussig et al. | |
| 6,481,284 B2 | 11/2002 | Geen et al. | |
| 6,612,029 B2 | 9/2003 | Behin et al. | |
| 6,744,173 B2 * | 6/2004 | Behin et al. | 310/309 |
| 6,744,174 B2 | 6/2004 | Paden et al. | |
| 6,757,092 B2 | 6/2004 | Abu-Ageel | |
| 6,792,804 B2 * | 9/2004 | Adams et al. | 73/514.32 |
| 6,845,668 B2 | 1/2005 | Kim et al. | |
| 6,865,944 B2 | 3/2005 | Glenn et al. | |
| 6,868,726 B2 | 3/2005 | Lemkin et al. | |
| 7,036,373 B2 | 5/2006 | Johnson et al. | |
| 7,258,010 B2 | 8/2007 | Horning et al. | |
| 7,357,874 B2 | 4/2008 | Moffat et al. | |
| 7,444,868 B2 | 11/2008 | Johnson | |
| 7,469,588 B2 | 12/2008 | LaFond et al. | |
| 7,504,757 B2 | 3/2009 | Subramanian et al. | |
| 7,690,254 B2 | 4/2010 | Pilchowski et al. | |
| 7,849,742 B2 | 12/2010 | Wang et al. | |
| 7,872,394 B1 | 1/2011 | Gritters et al. | |
| 7,984,648 B2 | 7/2011 | Horning et al. | |
| 8,011,247 B2 | 9/2011 | Glenn | |
| 8,187,902 B2 | 5/2012 | Weinberg et al. | |
| 8,549,922 B2 | 10/2013 | Kalnitsky et al. | |
| 2003/0106372 A1 | 6/2003 | Adams et al. | |
| 2003/0123124 A1 | 7/2003 | Abu-Ageel | |
| 2003/0183008 A1 | 10/2003 | Bang et al. | |
| 2005/0284222 A1 | 12/2005 | Johnson et al. | |
| 2010/0213791 A1 | 8/2010 | Kandori et al. | |
| 2012/0130672 A1 | 5/2012 | Horning et al. | |

FOREIGN PATENT DOCUMENTS

| | | |
|---|---|---|
| JP | 2005327711 | 11/2005 |
| JP | 2007309936 | 11/2007 |
| WO | 03050889 | 6/2003 |

OTHER PUBLICATIONS

Japan Patent Office, "Office Action from JP Application No. 2011-255395 mailed Oct. 8, 2015", "from Foreign Counterpart of U.S. Appl. No. 13/301,172", Oct. 8, 2015, pp. 1-6, Published in: JP.

China Patent Office, "First Office Action for CN Patent Application No. 201110456815.7", "from Foreign Counterpart to U.S. Appl. No. 13/301,172", Mar. 9, 2015, pp. 1-14, Published in: CN.

European Patent Office, "European Search Report", "from EP Counterpart of U.S. Appl. No. 13/301,145", Jun. 16, 2014, Published in: EP.

European Patent Office, "Office Action from EP Application No. 111902011 mailed Jul. 11, 2014", "from Foreign Counterpart of U.S. Appl. No. 13/301,145", Jul. 11, 2014, pp. 1-4, Published in: EP.

European Patent Office, "Office Action from EP Application No. 11190200.3 mailed Jul. 11, 2014", "from Foreign Counterpart of U.S. Appl. No. 13/301,172", Jul. 11, 2014, pp. 1-6, Published in: EP.

Molfese et al, "Analysis, testing and optimisation of electrostatic comb-drive levitational actuators", "Analog Integr Circ Sig Process", Dec. 22, 2005, pp. 33-40, No. 48, Publisher: Springer Science + Business Media, LLC, Published in: Pisa, Italy.

Painter et al, "Effect of Levitation Forces on the Performance of Surface Micromachined MEMS Gyroscopes", Oct. 24, 2004, pp. 508-511, vol. 1, Publisher: IEEE.

Tang et al, "Electrostatic Comb Drive Levitation and Control Method", "Journal of Microelectromechanical Systems", Dec. 1992, pp. 170-178, vol. 1, No. 4, Publisher: IEEE.

European Patent Office, "European Search Report ", "from EP Counterpart of U.S. Appl. No. 13/301,172", Jun. 16, 2014, Published in: EP.

Iyer, Sitaraman et al, "Modeling Methodology for a CMOS-MEMS Electrostatic Comb", May 6, 2002, pp. 114-125, vol. 4755, Publisher: International Society for Optical Engineering, Published in: US.

Lakdawala, Hasnain et al. , "Temperature Control of CMOS Micromachined Sensors", 2002, pp. 324-327, Publisher: IEEE Internatinal Micro Electro Mechanical Systems Conference, Published in: New York, NY.

Tang et al., "Electrostatically Balanced Comb Drive for Controlled Levitation", "Solid-State Sensor and Actuator Workshop 4th Technical Digest", Jun. 1990, pp. 23-27, Publisher: IEEE.

Timpe et al., "Levitation compensation method for dynamic electrostatic comb-drive actuators", "Science Direct Sensors and Actuators A.", Feb. 7, 2008, pp. 383-389, No. 143, Publisher: Elsevier.

* cited by examiner

MEMS VERTICAL COMB STRUCTURE WITH LINEAR DRIVE/PICKOFF

CROSS-REFERENCE TO RELATED APPLICATIONS

This application claims the benefit of priority to U.S. Provisional Application No. 61/416,485, filed on Nov. 23, 2010, the disclosure of which is incorporated herein by reference.

BACKGROUND

A micro-electro-mechanical system (MEMS) sensor, such as a MEMS accelerometer, consists of a mass, such as silicon, suspended by springy flexures, along with some form of pickoff and feedback mechanism. The mass/suspension system deflects either in the plane or out-of-plane in response to an acceleration. Pickoff mechanisms, which measure this deflection, often use capacitive pickoff. In-plane deflection is typically measured using comb structures. Out-of-plane motion is typically measured using capacitive sense plates positioned below and/or above the proof mass. Typical in-plane sensors have an advantage over such out-of-plane sensors in that the in-plane comb pickoff is approximately linear with deflection (and therefore to acceleration). However, capacitive plate pickoffs, in contrast, are proportional to 1/deflection and, therefore, are nonlinear.

SUMMARY

In one embodiments, a Micro-electro-mechanical system (MEMS) sensor is provided. The MEMS sensor comprises a substrate; and at least one proof mass having a first plurality of combs. The proof mass is coupled to the substrate via one or more suspension beams such that the proof mass and the first plurality of combs are movable. The MEMS sensor also comprises at least one anchor having a second plurality of combs. The anchor is coupled to the substrate such that the anchor and second plurality of combs are fixed in position relative to the substrate. The first plurality of combs are interleaved with the second plurality of combs. Each of the combs in the first plurality of combs and the second plurality of combs comprises a plurality of conductive layers electrically isolated from each other by one or more non-conductive layers. Each conductive layer is individually coupled to a respective electric potential such that capacitance between the first plurality of combs and the second plurality of combs varies approximately linearly with displacement of the movable combs in an out-of-plane direction.

DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

Figure 1:
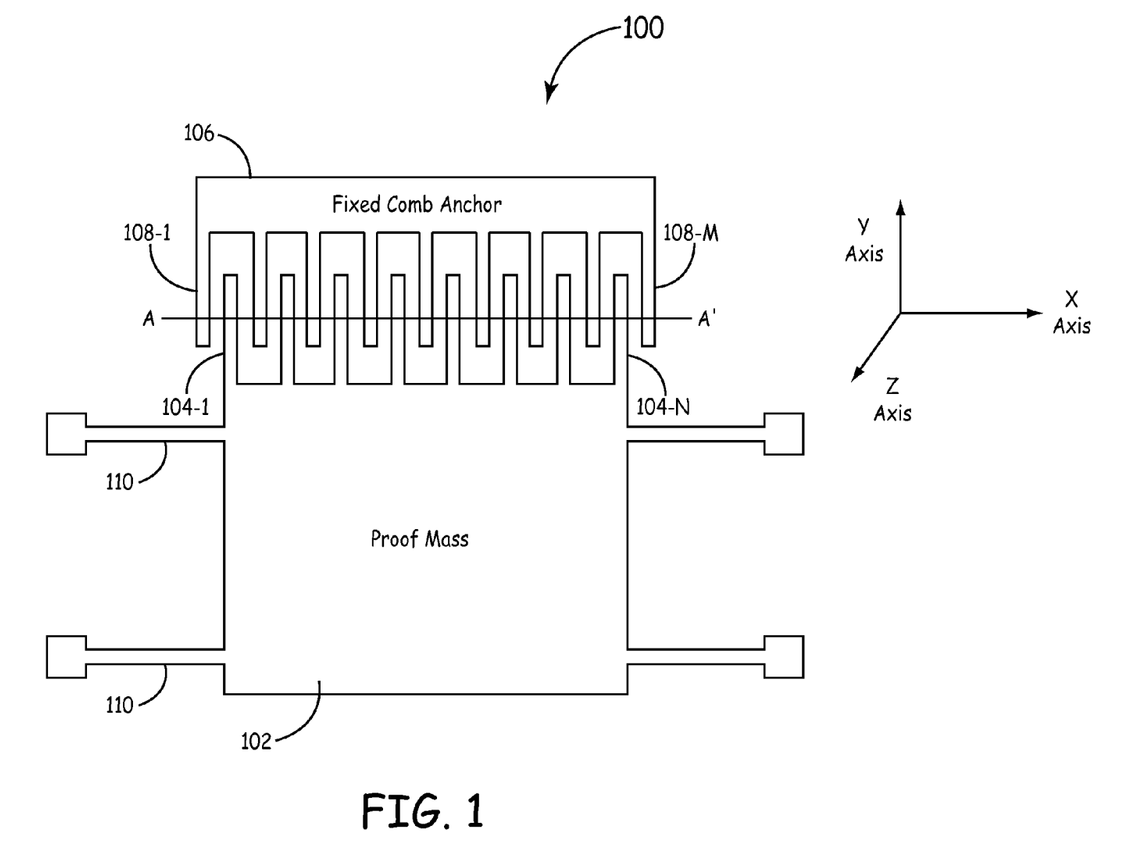
FIG. 1 is a partial top view of one embodiment of an exemplary Micro-electro-mechanical system (MEMS) sensor.

FIG. 1 is a partial top view of one embodiment of an exemplary Micro-electro-mechanical system (MEMS) sensor 100, such as a MEMS gyroscope or a MEMS accelerometer. In particular, FIG. 1 includes a top view of one proof mass 102 in the MEMS sensor 100 for purposes of explanation. However, it is to be understood that the MEMS sensor 100 can include more than one proof mass. The proof mass 102 is suspended by a plurality of suspension beams 110 that are coupled to a substrate. The suspension beams 110 permit the proof mass 102 to move or deflect from a resting position. The proof mass 102 also includes a plurality of movable combs or extensions 104-1 . . . 104-N. The movable combs 104-1 . . . 104-N are interdigitated or interleaved with fixed combs 108-1 . . . 108-M of fixed anchor 106. As the proof mass 102 moves, the relative position of the movable combs 104-1 . . . 104-N with respect to the fixed combs 108-1 . . . 108-M changes.

The MEMS sensor 100 is configured for an approximately linear out-of-plane pickoff. With respect to FIG. 1, and as used herein, displacement of the proof mass 102 along the x axis or the y axis is referred to as in-plane motion while displacement of the proof mass 102 along the z axis is referred to as out-of-plane motion. Hence, measuring capacitance changes due to motion of the movable combs 104 along the z axis is referred to as out-of-plane pickoff. As used herein, the terms "out-of-plane" and "vertical" are used interchangeably. Conventional MEMS sensors typically measure out-of-plane motion using lower and/or upper capacitive sense plates. However, upper/lower capacitive plate pickoffs are proportional to 1/deflection and, therefore, have a nonlinear response. The non-linearity makes conventional out-of-plane sensors more sensitive to vibration, shock, acceleration, etc. than a linear sensor. The non-linearity also makes conventional out-of-plane sensors more difficult to calibrate versus a linear sensor.

Figure 2:
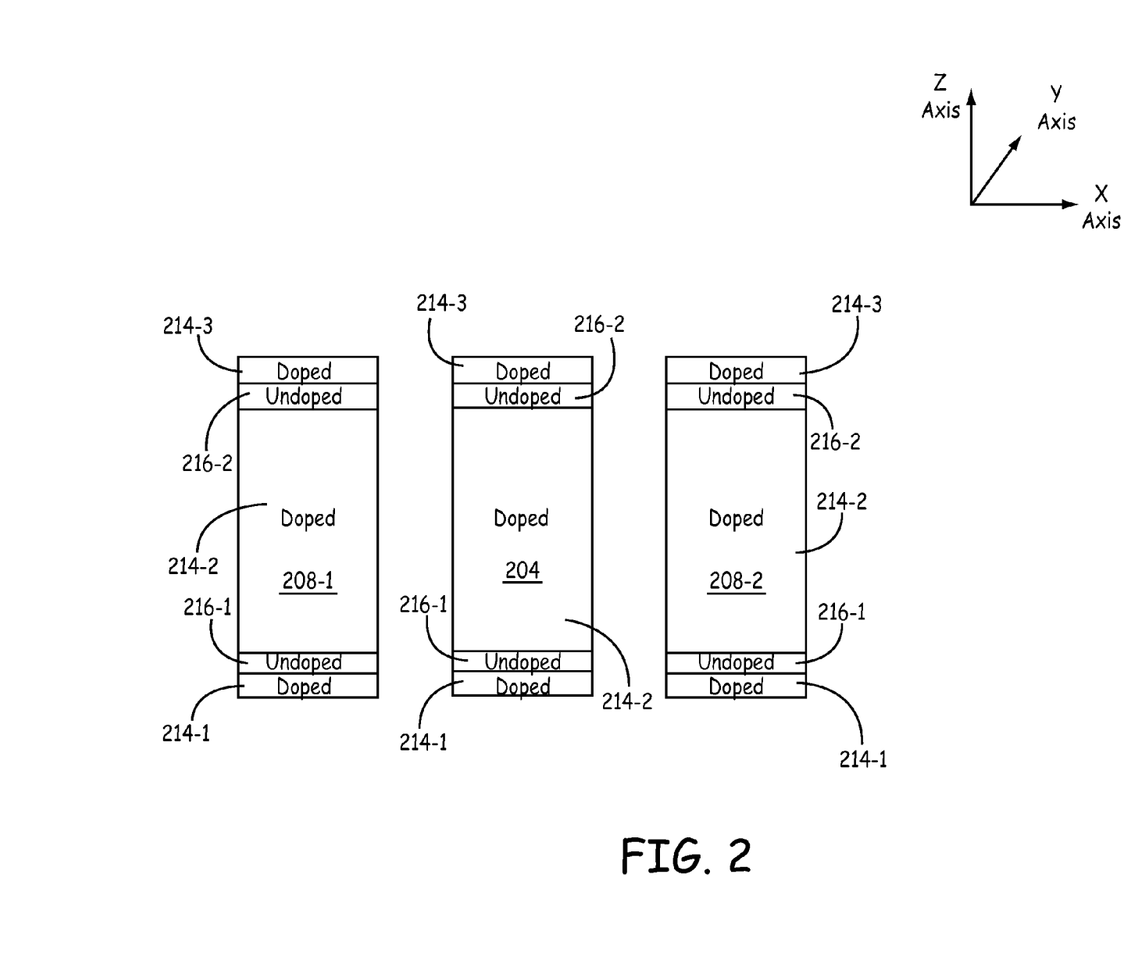
FIG. 2 is a cross-section of one embodiment of exemplary multi-layer combs.

In contrast to conventional MEMS sensors for measuring out-of-plane motion, MEMS sensor 100 utilizes multi-layer combs to provide an out-of-plane pickoff that is approximately linear with deflection along the z axis. For example, FIG. 2 depicts a cross-section of one embodiment of exemplary multi-layer combs 204 and 208 along the line A-A'. Comb 204 is a movable comb and combs 208-1 and 208-2 are fixed combs. Each of combs 204 and 208 comprise a plurality of conductive layers 214 separated from one another by non-conductive layers 216. In this exemplary embodiment, each of combs 208 and 204 has three conductive layers 214. In particular, the center conductive layer 214-2 in each of combs 208 and 204 is larger than the other conductive layers 214-1 and 214-2. However, it is to be understood that other configurations and/or numbers of conductive layers 214 can be used in other embodiments.

Each of the fixed combs 208 and each of the movable combs 204 are formed from a block of silicon in this embodiment. In particular, epitaxial silicon is deposited on a wafer of silicon. The epitaxial silicon is then grown non-homogeneously to produce the conductive layers 214 and non-conductive layers 216. For example, in this embodiment, the epitaxial film from which the structure is etched is grown in five layers. As the region which will form the first conductive layer is grown, a dopant is applied to the region at high levels which increases the conductive properties of the region. In other words, the region is highly or heavily doped. As used herein a highly or heavily doped region means that the ratio of dopant atoms to silicon atoms is high enough that the region is overall electrically conductive. For example, in some embodiments, the ratio of dopant atoms to silicon atoms is on the order of, or greater than, one per hundred thousand atoms. In some embodiments, the dopant that is used is boron. However, it is to be understood that other dopants, such as phosphorus or arsenic, can be used in other embodiments.

To apply the dopant, a dopant source is turned on in the epitaxial reactor at the same time as a silicon source. Once the conductive region has been grown to a desired thickness, the dopant source is turned off while the silicon source is left on to grow a non-conductive region. For example, in some embodiments, the first conductive region 214-1 is grown to a thickness of approximately 5-10% of the total thickness of the multi-layer epitaxial silicon. In one exemplary embodiment, the first conductive region is grown to approximately 2 μm. The first non-conductive region can also be grown, for example, to approximately 5-10% of the total thickness. In particular, in some embodiments, the non-conductive region is grown to 1-2 μm. The non-conductive region has either no dopant or is lightly doped. Lightly doped refers to the ratio of dopant atoms to silicon atoms being at a sufficiently low level that the region is overall electrically non-conductive. For example, in some embodiments, the ratio of dopant atoms to silicon atoms is on the order of one per 100 million atoms or less.

The dopant source is then turned on again once the non-conductive region has reached a desired thickness. The dopant source remains on until the next conductive region has reached a desired thickness. For example, the inner conductive region 214-2 is thicker than the other conductive regions and is grown to approximately 60-80% the total thickness of the multi-layer epitaxial silicon. In some embodiments, the inner conductive region 214-2 is grown to approximately 14-20 μm. The dopant source is then sequentially turned off and on again in a similar pattern to grow the remaining non-conductive and conductive regions, respectively. It is to be understood that the thicknesses discussed above are provided by way of example and that other thicknesses can be used in other embodiments. In addition, in other embodiments, the conductive and non-conductive layers are formed using other processes. For example, an insulating oxide can be applied to a silicon comb and then coated with a metal, polysilicon or other conductive layer.

Structures such as proof masses, suspension springs and combs are etched into the multi-layer epitaxial silicon. Etching the structures physically and electrically disconnects some structures from others. For example, movable combs 204 are neither physically nor electrically connected to fixed combs 208. Each of the resultant conductive layers 214 in each of the combs 204 and 208 is then individually coupled to an electric potential or voltage source (e.g. positive voltage, negative voltage or ground) such as through vias, for example. As used herein, individually applying an electric potential to a conductive layer means that the electric potential applied to the respective layer is not influenced or determined by the electric potential applied to another layer. In particular, the voltages are individually applied to produce a configuration which results in an approximately linear response to deflection of the movable comb 204 in the vertical or out-of-plane direction.

Figure 3:
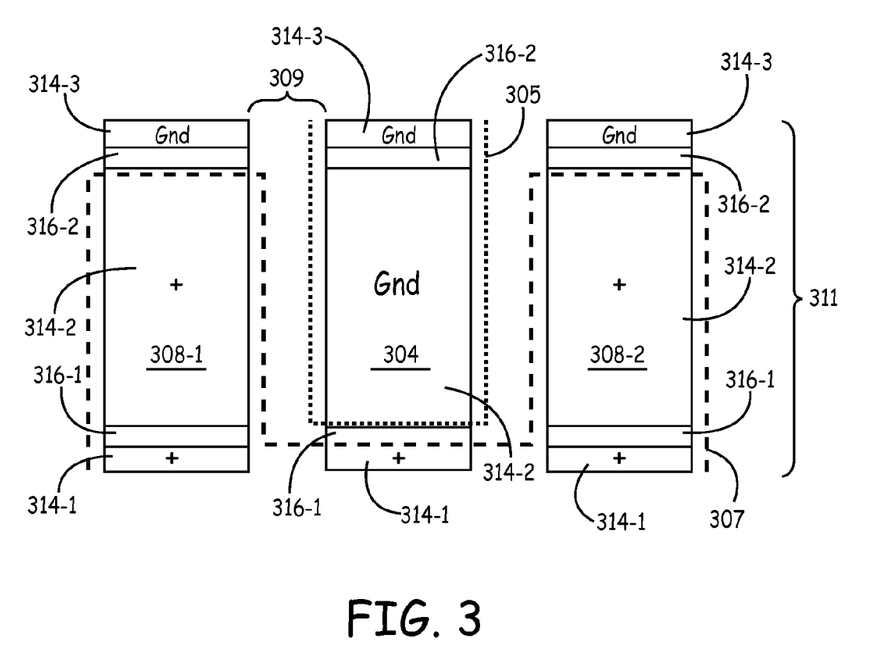
FIG. 3 is a cross-section of one embodiment of exemplary multi-layer combs depicting an exemplary biasing configuration.

For example, as shown in FIG. 3, the outer conductive layer 314-3 in each of the fixed combs 308 and the movable comb 304 can be held at ground while the inner conductive layer 314-2 and outer conductive layer 314-1 of each of the fixed combs 308 is biased to a voltage. The inner conductive layer 314-2 of the movable comb 304 is also held at ground. It should be noted that although the bias applied to the conductive layers 314-1 and 314-2 of the fixed combs 308 is depicted as a positive voltage, it is to be understood that the bias can be positive, negative or time-varying between a negative value and a positive value. The time-varying bias causes the movable comb 204 to oscillate along the drive axis into and out of the page.

In addition, by individually applying the electric potential to each conductive layer as shown in FIG. 3, a vertical electric field configuration is created which provides an approximately linear response to vertical displacement of the movable comb 304. The electric field configuration is depicted by the regions 305 and 307 that are outlined with dashed lines. Because the upper conductive layers 314-3 are all grounded, there is little or no fringing field in the region of the conductive layers 314-3. Similarly, since the bottom conductive layers 314-1 are all similarly biased, there is little or no fringing field in the region of the conductive layers 314-1. Therefore, the capacitance is defined predominantly by the overlap of the central doped layers 314-2. As long as the gap 309 between combs is small compared to the height 311 of the combs, the capacitance will vary approximately linearly with vertical displacement of movable comb 304. The multi-layer combs and vertical electric field configuration can be implemented in any capacitance-pickoff device with a vertical displacement, such as, but not limited to, accelerometers.

Figure 4:
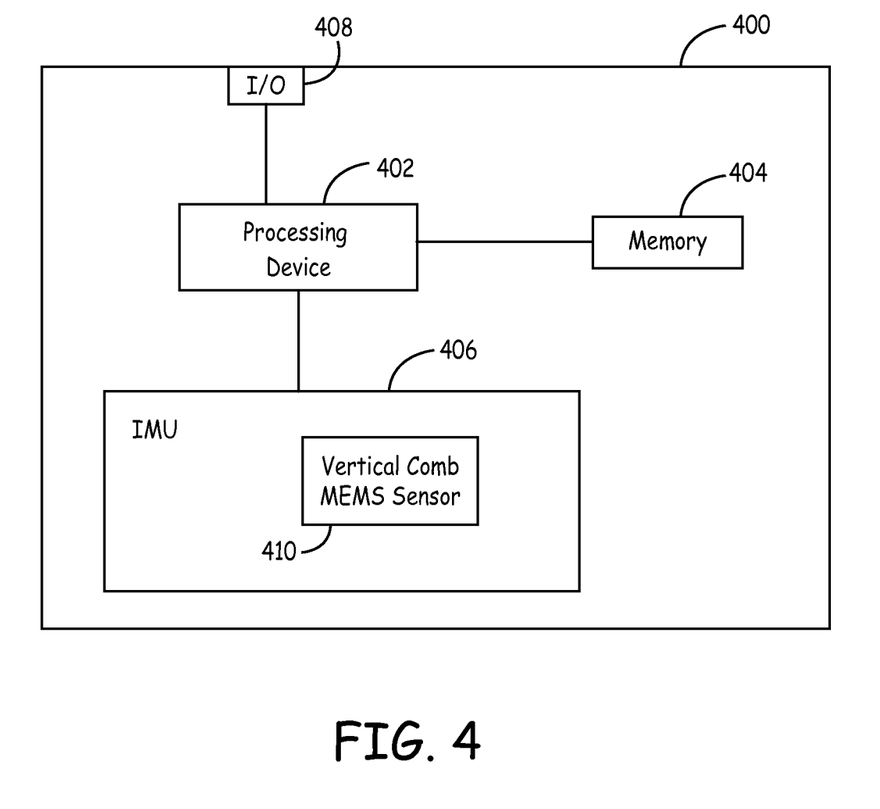
FIG. 4 is a block diagram of one embodiment of an electronic system.

FIG. 4 is a block diagram of one embodiment of an electronic system 400 including an inertial measurement unit (IMU) 406 having a MEMS sensor 410 configured to produce an approximately linear response for out-of-plane displacement as described above. For example, in this embodiment, the MEMS sensor 410 is implemented as an accelerometer. Although only one MEMS sensor 410 is shown in this example, it is to be understood that more than one MEMS sensor can be used in other embodiments. The MEMS sensor 410 includes a plurality of fixed combs interleaved with a plurality of movable combs. Each of the fixed combs and movable combs includes a plurality of conductive layers, as described above. A voltage is individually applied to each conductive layer such that a vertical electric field configuration is produced that has an approximately linear response to out-of-plane or vertical displacement.

The electronic system 400 includes one or more processing devices 402 coupled to one or more memory devices 404 and the IMU 406. The IMU 406 provides motion measurements to the one or more processing devices 402. The motion measurements can include measurements of linear and/or angular acceleration. The one or more processing devices 402 process the motion measurements for the intended application. For example, in some embodiments, the electronic system 400 is implemented as an inertial navigation system. In such embodiments, the one or more memory devices 404 include instructions which, when executed by the one or more processing devices 402, cause the one or more processing devices 402 to implement navigation functions such as providing an inertial navigation solution based on the motion measurements. The electronic system 400 can also include an input and/or output port 408 for sending and receiving signals with other devices. For example, the electronic system 400 receives navigation data from a global navigation satellite system (GNSS) which is combined with the motion measurements from the IMU 406 by the one or more processing devices 402 to calculate a combined navigation solution. The electronic system 400 can be integrated into other systems, such as, but not limited to, an aircraft, vehicle, mobile phone, missile, video game controller or other apparatus for which inertial data is desired.

The one or more processing devices 402 can include a central processing unit (CPU), microcontroller, microprocessor (e.g., a digital signal processor (DSP)), field programmable gate array (FPGA), application specific integrated circuit (ASIC) and other processing devices. The one or more memory devices 704 can include tangible media such as magnetic or optical media. For example, tangible media can include a conventional hard disk, compact disk (e.g., read only or re-writable), volatile or non-volatile media such as random access memory (RAM) including, but not limited to, synchronous dynamic random access memory (SDRAM), double data rate (DDR) RAM, RAMBUS dynamic RAM (RDRAM), static RAM (SRAM), etc.), read only memory (ROM), electrically erasable programmable ROM (EEPROM), and flash memory, etc.

Figure 5:
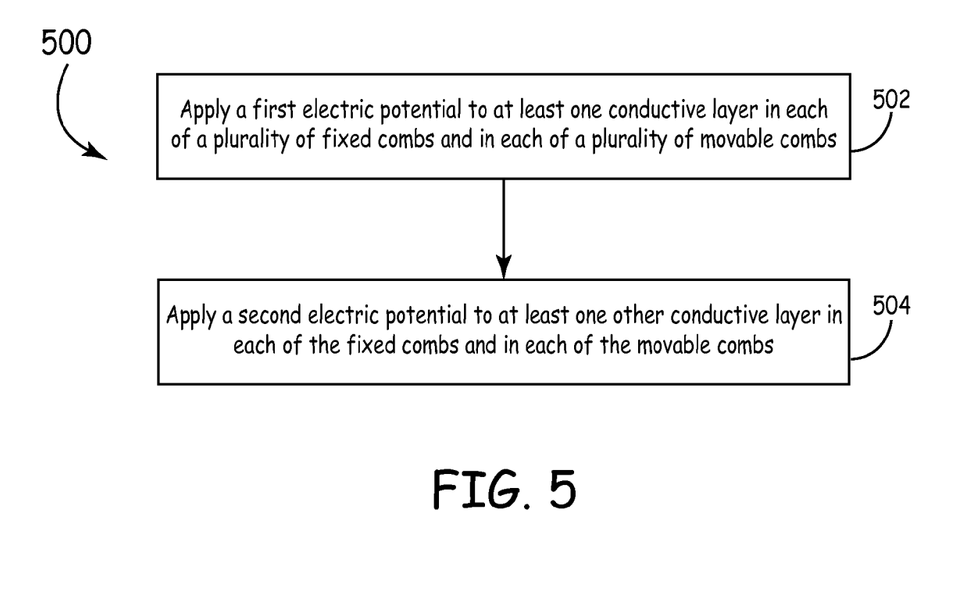
FIG. 5 is a flow chart depicting one embodiment of a method of producing an approximately linear vertical comb MEMS sensor.

FIG. 5 is a flow chart depicting one embodiment of a method 500 of producing an approximately linear vertical comb MEMS sensor. Method 500 can be implemented with a multi-layered comb structure such as described above with respect to FIGS. 1-3. At block 502, a first electric potential is applied to at least one conductive layer in each of a plurality of fixed combs and in each of a plurality of movable combs. The fixed combs and movable combs are interleaved, as described above. The conductive layers in each comb are separated from one another by one or more non-conductive layers. For example, as described above, the conductive and non-conductive layers are formed by alternately growing doped and undoped regions of epitaxial silicon.

At block 504, a second electric potential is applied to at least one other conductive layer in each of the fixed combs and in each of the movable combs. The first and second electric potentials are selected and applied to create a vertical electric field configuration in which changes in capacitance of the fixed and movable combs varies approximately linearly with out-of-plane displacement of the movable combs. For example, the first electric potential is ground in some embodiments and is applied to a first outer conductive in each of the fixed and movable combs. As shown in FIG. 2, the first outer conductive layers (e.g. layers 214-3) are approximately coplanar when in a resting position. The ground potential is also applied to an inner conductive layer in each of the movable combs.

The second electric potential in this embodiment is a time-varying voltage that is applied to the inner conductive layer of each of the fixed combs. In addition, in this embodiment, the time-varying voltage is also applied to the second outer conductive layer (e.g. 214-1) in each of the fixed and movable combs. However, in other embodiments, a separate static positive or negative voltage can be applied to the second outer conductive layer. The individual application of the electric potentials to the different layers in each of the fixed and movable combs creates an electric field configuration in which capacitance of the combs varies approximately linearly with out-of-plane displacement of the movable combs.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A Micro-electro-mechanical system (MEMS) sensor, comprising:
    a substrate;
    at least one proof mass having a first plurality of combs, wherein the proof mass is coupled to the substrate via one or more suspension beams such that the proof mass and the first plurality of combs are movable;
    at least one anchor having a second plurality of combs, wherein the anchor is coupled to the substrate such that the anchor and second plurality of combs are fixed in position relative to the substrate;
    wherein the first plurality of combs are interleaved with the second plurality of combs;
    wherein each of the combs in the first plurality of combs and the second plurality of combs comprises a plurality of conductive layers electrically isolated from each other by one or more non-conductive layers;
    wherein each conductive layer is individually coupled to a respective electric potential such that at least one conductive layer of each of the combs in the first plurality of combs and the second plurality of combs is coupled to a first electric potential and at least one conductive layer of each of the combs in the first plurality of combs and the second plurality of combs is coupled to a second potential;
    wherein individual application of the first and second electric potentials to the respective conductive layers creates an electric field configuration in which capacitance between the first plurality of combs and the second plurality of combs varies approximately linearly with displacement of the movable combs in an out-of-plane direction.

2. The MEMS sensor of claim 1, wherein each comb of the first and second plurality of combs comprises a first outer conductive layer, a second outer conductive layer, and an inner conductive layer.

3. The MEMS sensor of claim 2, wherein the first outer conductive layer of each comb of the first and second plurality of combs is coupled to a positive voltage;
    wherein the second outer conductive layer of each comb of the first and second plurality of combs is coupled to ground; and wherein the inner layer of each comb of the first plurality of combs is coupled to ground and the inner layer of each comb of the second plurality of combs is coupled to the positive voltage.

4. The MEMS sensor of claim 2, wherein the inner conductive layer of each comb of the first and second plurality of combs is thicker than the respective first and second outer conductive layers.

5. The MEMS sensor of claim 4, wherein the inner conductive layer has thickness between approximately 14-20 μm, and each of the first and second outer conductive layers has a thickness of approximately 2 μm.

6. The MEMS sensor of claim 1, wherein the combs of the first and second plurality of combs are comprised of silicon, the plurality of conductive layers comprising regions of doped silicon and the one or more non-conductive layers comprising regions of undoped silicon.

7. The MEMS sensor of claim 1, wherein the plurality of conductive layers in each comb do not have a uniform thickness.

8. An electronic system comprising:
   an inertial measurement unit comprising one or more Micro-electro-mechanical system (MEMS) sensors configured to provide motion measurements; and
   a processing unit configured to calculate a navigation solution based on the motion measurements received from the inertial measurement unit;
   wherein the one or more MEMS sensors each comprise:
      a plurality of fixed combs; and
      a plurality of movable combs interleaved with the plurality of fixed combs;
      wherein each of the plurality of fixed and movable combs comprises a plurality of conductive layers separated by one or more non-conductive layers, each conductive layer individually coupled to a respective voltage such that at least one conductive layer of each of the combs in the plurality of fixed combs and the plurality of moveable combs is coupled to a first voltage and at least one conductive layer of each of the combs in the plurality of fixed combs and the plurality of moveable combs is coupled to a second voltage;
      wherein individual application of the first and second voltages to the respective conductive layers creates a vertical electric field configuration in which the capacitance between the plurality of fixed and movable combs varies approximately linearly with vertical displacement of the movable combs.

9. The electronic system of claim 8, wherein the plurality of conductive layers of each movable and fixed comb comprises:
   first and second outer conductive layers, each outer conductive layer adjacent to an outer surface of the respective comb; and
   at least one inner conductive layer.

10. The electronic system of claim 9, wherein the first outer conductive layer of each fixed and movable comb are coupled to ground;
   wherein the second outer conductive layer of each fixed and movable comb are coupled to a positive voltage;
   wherein the at least one inner conductive layer of the fixed combs is coupled to the positive voltage and the at least one inner conductive layer of the movable combs is coupled to ground.

11. The electronic system of claim 9, wherein the at least one inner conductive layer of each comb is thicker than each of the respective outer conductive layers.

12. The electronic system of claim 11, wherein the at least one inner conductive layer has thickness between approximately 14-20 μm, and each of the first and second outer conductive layers has a thickness of approximately 2 μm.

13. The electronic system of claim 8, wherein the fixed and movable combs are comprised of silicon;
   wherein the plurality of conductive layers comprise regions of silicon doped with a ratio of dopant atoms to silicon atoms high enough that the regions are overall electrically conductive, wherein the one or more non-conductive layers comprise regions of silicon doped with a ratio of dopant atoms to silicon atoms low enough that the regions are overall electrically non-conductive.

14. The electronic system of claim 8, wherein the one or more non-conductive layers are thinner than each of the plurality of conductive layers.

15. The electronic system of claim 8, wherein the at least one MEMS sensor is a MEMS accelerometer.

* * * * *